United States Patent
Lecomte et al.

(10) Patent No.: US 8,816,783 B2
(45) Date of Patent: *Aug. 26, 2014

(54) DEVICE FOR AN ATOMIC CLOCK

(75) Inventors: Steve Lecomte, Bernex (CH); Jacques Haesler, Murten (CH)

(73) Assignee: CSEM Centre Suisse d'Electronique et de Microtechnique S.A., Neuchatel (CH)

(*) Notice: Subject to any disclaimer, the term of this patent is extended or adjusted under 35 U.S.C. 154(b) by 96 days.

This patent is subject to a terminal disclaimer.

(21) Appl. No.: 13/393,996

(22) PCT Filed: Sep. 1, 2010

(86) PCT No.: PCT/CH2010/000214
§ 371 (c)(1),
(2), (4) Date: May 10, 2012

(87) PCT Pub. No.: WO2011/026251
PCT Pub. Date: Mar. 10, 2011

(65) Prior Publication Data
US 2012/0212298 A1 Aug. 23, 2012

(30) Foreign Application Priority Data

Sep. 4, 2009 (EP) .................................... 09405149
May 7, 2010 (CH) ........................................ 703/10

(51) Int. Cl.
*H03B 17/00* (2006.01)
*H03L 7/26* (2006.01)
*H01S 1/06* (2006.01)
*G04F 5/14* (2006.01)

(52) U.S. Cl.
CPC *G04F 5/14* (2013.01); *H03B 17/00* (2013.01); *H03L 7/26* (2013.01); *H01S 1/06* (2013.01); *G04F 5/145* (2013.01)
USPC .......................................... 331/94.1; 372/70

(58) Field of Classification Search
CPC ............. G04F 5/14; G04F 5/145; H01S 1/06; H03B 17/00; H03L 7/26
USPC ................ 331/3, 94.1; 356/436, 437; 372/32, 372/70–75
See application file for complete search history.

(56) References Cited

U.S. PATENT DOCUMENTS 4,764,731 A * 8/1988 Salour ........................... 359/337
(Continued)

FOREIGN PATENT DOCUMENTS

| EP | 0 550 240 A1 | 7/1993 |
| EP | 0550240 A1 | 7/1993 |

OTHER PUBLICATIONS

International Preliminary Report on Patentability (Form PCT/ISA/237), of International Application No. PCT/CH2010/000214, date of mailing Jan. 27, 2011.
International Search Report of PCT/CH2010/000214, mailing date Jan. 27, 2011.

(Continued)

*Primary Examiner* — Levi Gannon
(74) *Attorney, Agent, or Firm* — Westerman, Hattori, Daniels & Adrian, LLP

(57) ABSTRACT

A device for an atomic clock, including: a laser source (102) that generates a laser beam; a splitter (101) that makes it possible to divert and allow a portion of the laser beam to pass therethrough in accordance with a predefined percentage; a quarter-wave plate (105) that modifies the linear polarization of the laser beam into circular polarization and vice versa; a gas cell arranged on the circular polarization laser beam; a mirror (107) sending the laser beam back toward the gas cell (106); a first photodetector (108*a*), and a polarizer (103) arranged between the laser beam outlet and the splitter in order to protect the laser source from the retroreflections emitted by different optical elements constituting the device.

9 Claims, 4 Drawing Sheets

(56) References Cited

U.S. PATENT DOCUMENTS

| | | | |
|---|---|---|---|
| 5,340,986 A | | 8/1994 | Wong |
| 5,751,193 A | * | 5/1998 | Nakajima et al. ............... 331/3 |
| 6,222,424 B1 | * | 4/2001 | Janssen et al. ............... 331/94.1 |
| 6,525,825 B2 | * | 2/2003 | de Groot et al. ............. 356/517 |
| 7,064,835 B2 | | 6/2006 | Riley, Jr. et al. |
| 7,102,451 B2 | * | 9/2006 | Happer et al. ............... 331/94.1 |
| 7,323,941 B1 | * | 1/2008 | Happer et al. .................... 331/3 |
| 7,619,485 B2 | * | 11/2009 | DeNatale et al. ............ 331/94.1 |
| 7,982,944 B2 | * | 7/2011 | Kippenberg et al. ......... 359/330 |
| 8,237,514 B2 | * | 8/2012 | Aoyama et al. .............. 331/94.1 |
| 8,242,851 B2 | | 8/2012 | Youngner et al. |
| 8,379,206 B2 | * | 2/2013 | Kachanov et al. ............ 356/436 |
| 8,432,162 B2 | * | 4/2013 | Nagasaka ................... 324/244.1 |
| 2005/0264818 A1 | | 12/2005 | Gollier |
| 2007/0139128 A1 | | 6/2007 | Koyama |
| 2007/0146085 A1 | | 6/2007 | Koyama |
| 2009/0128820 A1 | | 5/2009 | Nomura |
| 2009/0180357 A1 | * | 7/2009 | Chen ............................ 368/155 |
| 2009/0302957 A1 | * | 12/2009 | Levi et al. .................... 331/94.1 |
| 2013/0003766 A1 | | 1/2013 | Savchenkov et al. |

OTHER PUBLICATIONS

Bendelli et al. "Optical Isolators for telecommunications: review and current trends," European Transactions on Telecommunications and Related Technologies, vol. 3, No. 4 (1992).

S. Knappe, "MEMS atomic clocks," Comprehensive Microsystems, Elsevier B.V., vol. 3, pp. 571-612 (2008).

International Search Report of PCT/CH2010/000215, mailing date of Jan. 20, 2011. Cited by Applicant in co-pending U.S. Appl. No. 13/394,012.

S. Knappe, "MEMS Atomic Clocks", Comprehensive Microsystems, Elsevier B.V., vol. 3, pp. 571-612 (2008). Cited by Applicant in co-pending U.S. Appl. NO. 13/394,012 as listed in ISR of PCT/CH2010/000215. Filed Mar. 2, 2013 as listed in ISR of PCT/CH2010/000214.

International Preliminary Report on Patentability (Form PCT/IB/373) of International Application No. PCT/CH2010/000215, dated Mar. 6, 2012 with Forms PCT/ISA/237. Cited by Applicant in co-pending U.S. Appl. No. 13/394,012.

Notice of Allowance and Fee(s) Due dated Apr. 22, 2014, issued in U.S. Appl. No. 13/394,012 (21 pages).

* cited by examiner

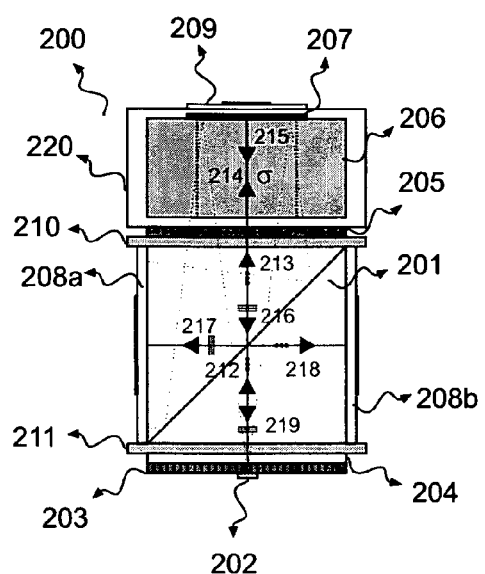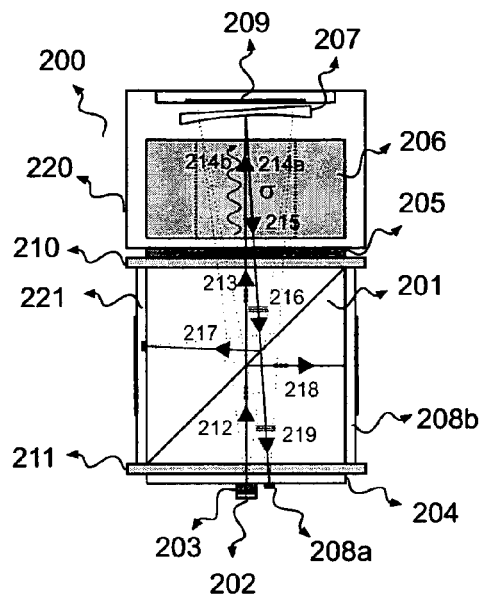
Fig. 6a        Fig. 6b
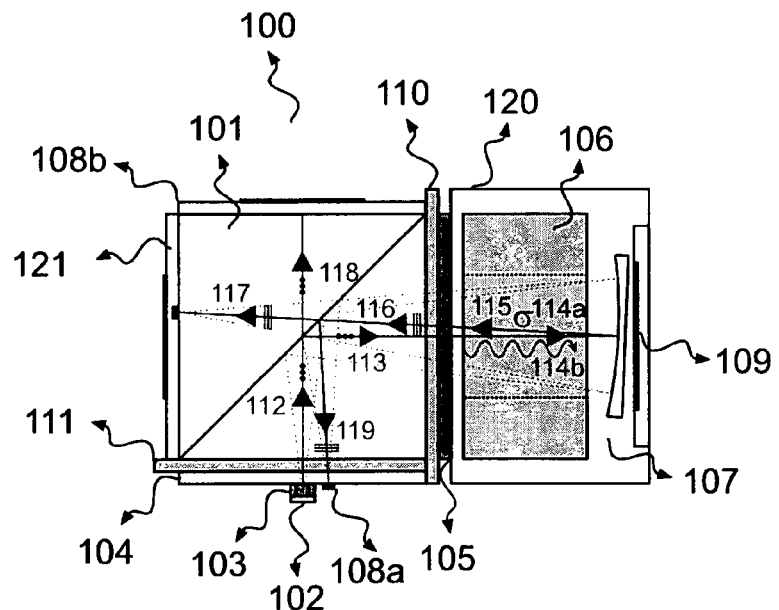
Fig. 7

DEVICE FOR AN ATOMIC CLOCK

INTRODUCTION

The present invention relates to the field of atomic clocks.

STATE OF THE ART

Miniature atomic clocks (with a volume of one $cm^3$ or less), with low electrical consumption (less than one Watt) and which allow for portable applications are devices that have been made possible by the combination of the physical CPT (coherent population trapping) or Raman principles with an atomic clock architecture based on a gas absorption cell. These two physical principles do not require any microwave cavity to interrogate the reference atoms (typically rubidium or cesium) and thus eliminate the volume constraint associated with conventional cell-type atomic clocks. The physical part of the clock, which consists of the light source, the optical elements, the gas cell, the photodetector and all the functions such as heating and magnetic field generation, will be the subject of the considerations that follow. The implementation of technologies such as vertical cavity surface-emitting lasers (VCSEL), the techniques of microfabrication for the gas cells and vacuum encapsulation have made it possible to massively reduce the volume and the electrical consumption of these atomic clocks. VCSEL lasers offer the possibility of combining the optical pumping function and the microwave interrogation of the reference atoms. This type of laser offers the following advantages: modulation of the injection current possible up to several gigahertz, low consumption, wavelength compatible with the standard reference atoms (rubidium or cesium), excellent life, operation at high temperature, low cost and ideally suited optical power. The silicon microstructuring technologies coupled with the methods for bonding/welding a glass substrate (typically Pyrex or quartz) on to a silicon substrate make it possible to produce gas cells with dimensions much smaller than what it is possible to produce with the conventional glass tube blowing and forming technique. The reduction of the dimensions of the gas cell is also accompanied by a reduction in the consumption needed to heat the gas cell.

Different arrangements of the physical part of such a clock have been produced. Most of the arrangements are based on a single passage of the laser beam through the cell (see S. Knappe, MEMS atomic clocks, Book chapter in Comprehensive Microsystems, vol. 3, p. 571 (2008), Ed. Elsevier), others exploit gas cells comprising mirrors inside the cell or else allowing for a double passage of the laser beam through the cell (see documents U.S. Pat. No. 7,064,835 and EP0550240). The arrangements with double passage of the light through the cell have the advantage of doubling the effective optical length of the cell and therefore improve the performance levels of the atomic clock (in terms of electrical consumption and/or of frequency stability). Nevertheless, these double-passage arrangements have not been implemented for reasons of instability of the device and in particular because of disturbances of the laser provoked by the light back-reflected by the mirrors on to the laser.

BRIEF DESCRIPTION OF THE INVENTION

The present invention therefore aims to propose a device for an atomic clock that allows for a double passage in the cell without the drawbacks of the prior art.

This aim is achieved with a device for an atomic clock comprising a laser source generating a laser beam, a splitter for deflecting and allowing a portion of the laser beam to pass according to a predefined percentage, a quarter-wave plate modifying the linear polarization of the laser beam into a circular polarization and vice versa, a gas cell placed on the laser beam of circular polarization, a mirror sending the laser beam back toward the gas cell, and a first photodetector, the splitter being placed between the laser source and the mirror, the quarter-wave plate being placed between the splitter and the mirror, the gas cell being placed between the quarter-wave plate and the mirror, in such a way that the polarization of the beam originating from the laser source via the splitter and arriving on the quarter-wave plate is linear according to the first angle and is modified by the quarter-wave plate into circular polarization, and so that the circular polarization of the beam reflected by the mirror and passing a second time through the gas cell is modified into linear polarization according to the second angle by the quarter-wave plate, the splitter directing a portion of the back-reflected beam toward the first photodetector, characterized in that the device also comprises a polarizer placed between the output of the laser beam and the splitter in order to protect the laser source from the back-reflections originating from the various optical elements that make up the device.

BRIEF DESCRIPTION OF THE FIGURES

The invention will be better understood from the following detailed description with reference to the appended drawings in which:

FIG. 6a is a schematic presentation of the design of the device of the invention with straight geometry and with double passage, particularly suited to the implementation of the concept of the CPT atomic clock FIG. 6b is a schematic presentation of the design of the device of the invention with straight geometry and double passage, particularly suited to the implementation of the concept of the Raman oscillator FIG. 7 is a schematic presentation of the design of the device of the invention with right-angle geometry and double passage, particularly suited to the implementation of the concept of the Raman oscillator.

DETAILED DESCRIPTION

Figure 1A:
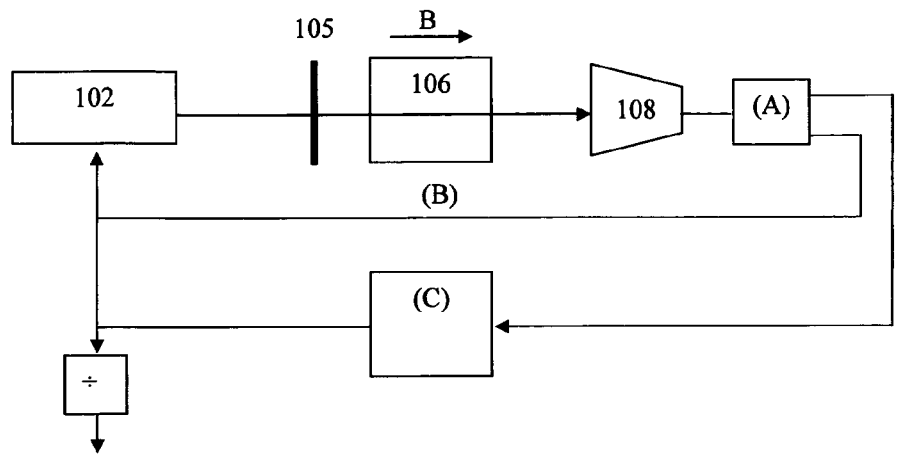
FIG. 1a is a schematic diagram of the CPT clock

FIG. 1a illustrates the schematic diagram of the CPT atomic clock comprising a laser diode 102, a λ/4 plate (or quarter-wave plate) 105, a gas cell (atomic) 106, a magnetic field B, a first photodetector 108, control electronics (A) and a microwave oscillator (C). The laser beam having passed through the gas cell 106 is picked up by the first photodetector 108 and is used by the control electronics to stabilize the frequency of the laser (B) and the frequency of the microwave oscillator (C).

Figure 1B:
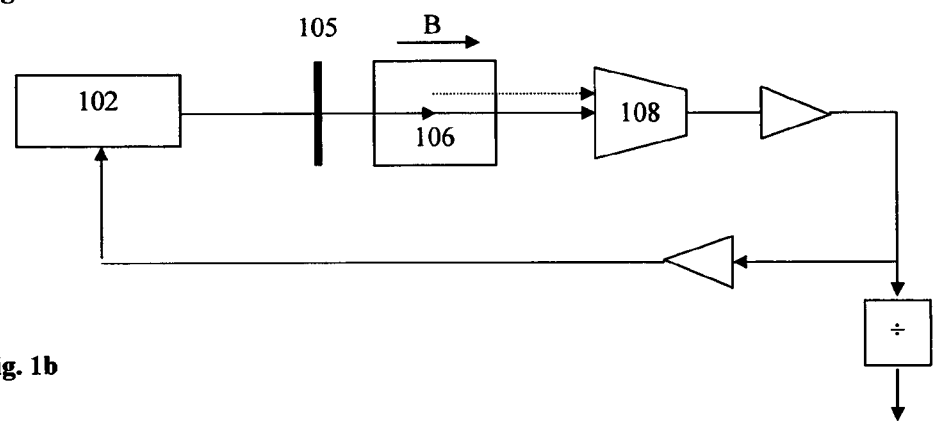
FIG. 1b is a schematic diagram of the Raman oscillator

FIG. 1b illustrates the schematic diagram of a closed loop mode Raman oscillator comprising a laser diode 102, a λ/4 plate (or quarter-wave plate) 105, a gas cell (atomic) 106, a magnetic field B, a first photodetector 108, a microwave frequency divider, and an RF amplifier. The laser beam emitted by the laser diode 102 undergoes, in the gas cell 106, a light-atom interaction which generates a complementary beam called a Raman beam. The two light beams are picked up by the first photodetector 108 and the frequency beat of these two beams is amplified and used as feedback on the laser to close the microwave loop of the Raman oscillator.

Figure 2:
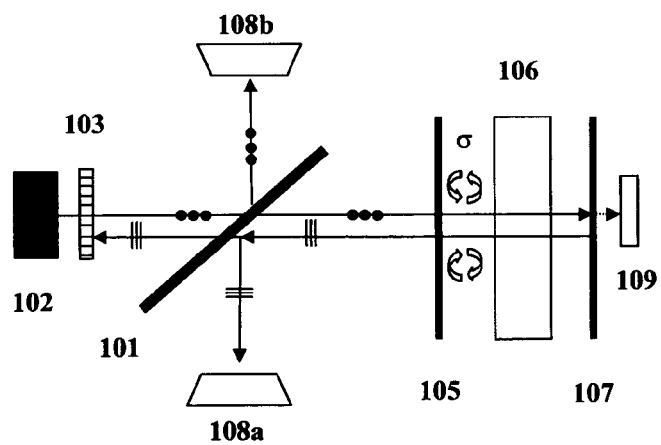
FIG. 2 is a simplified diagram of the invention

FIG. 2 illustrates the basic principle of the invention. In this figure, the polarization of the beam is symbolized by lines when it is perpendicular to the polarization of the beam emitted by the laser and by full circles when it is parallel thereto. The circular polarization is denoted "σ". The laser source 102 produces a laser beam which is generally linearly polarized and which is directed toward the polarizer 103, the transmission axis of which is oriented so as to allow all or part of the laser beam to pass, then toward the splitter 101 for which the splitting percentage is predefined. A portion of the beam is thus reflected toward the photodetector 108b. The splitter transmits the other portion of the beam toward a quarter-wave plate 105. The role of the plate 105 is to change the linear polarization of the laser beam to a circular polarization. In practice, the interaction between the light and the atoms of the gas cell 106 is optimum when it is produced with a beam of circular polarization. A portion of the beam leaving the gas cell 106 is then reflected by a mirror 107, which reverses the direction of its circular polarization, and thus passes a second time through the gas cell 106. On leaving the gas cell 106, the beam reaches the quarter-wave plate 105. Depending on the predefined splitting percentage of the splitter 101, this beam is partly deflected and reaches the photodetector 108a. Another portion of this beam is transmitted by the splitter 101 and is attenuated by the polarizer 103 because its polarization is perpendicular to that of the transmission axis of the polarizer 103, the laser source 102 thus being protected from the back-reflections. A small portion of the beam having passed through the gas cell 106 is transmitted by the mirror 107 and picked up by the photodetector 109.

Figure 3:
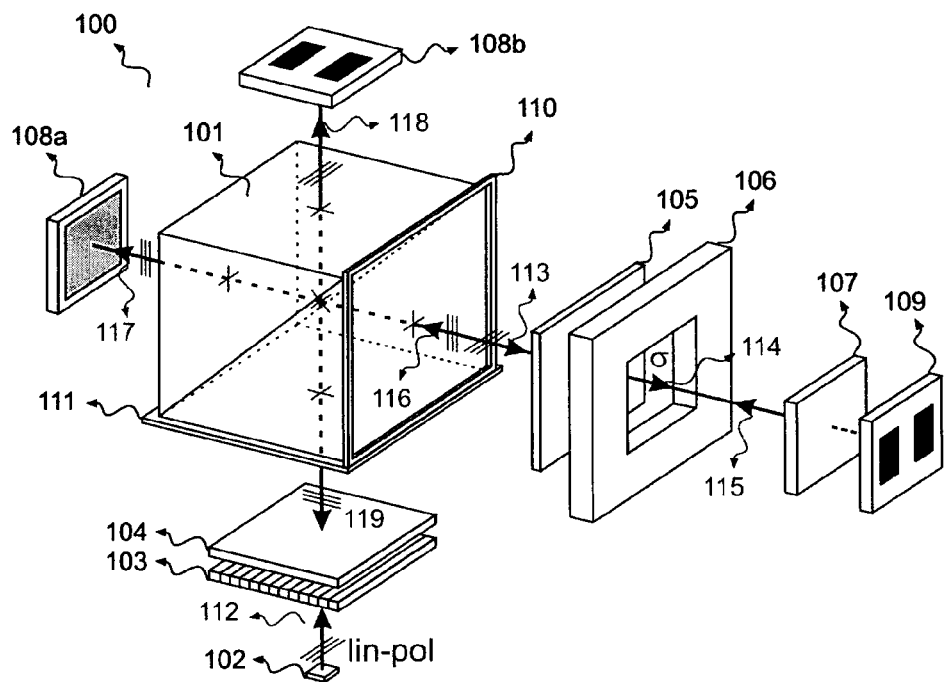
FIG. 3 is an exploded schematic presentation of the device of the invention with right-angle geometry and with double passage

A more complete exemplary embodiment is illustrated in FIG. 3 (exploded diagram). The splitter 101 is produced in the form of a splitter cube. This cube makes it possible to implement a double passage of the gas cell 106 which doubles the interaction between the light of the laser and the atomic medium. A better atomic signal, and thus a better stability of the frequency of the atomic clock, is obtained.

In FIG. 3, the optical assembly is based on a miniature cube 101 whose sides are preferably less than or equal to 1 mm, the cube 101 serving as splitter. According to a standard mode, the volume of the cube is typically 1 mm³.

The light beam from the laser diode 102 arrives on one of the sides of the cube 101. According to one embodiment, the laser diode is of vertical cavity surface-emitting (VCSEL) semiconductor type emitting a 795 nm divergent light beam. In other embodiments, other types of laser diodes having wavelengths typically varying from 780 nm to 894 nm can be used for a gas cell containing rubidium or cesium. This choice is dictated by the atomic composition of the gas cell. According to one embodiment, a collimation lens can be added in front of the laser diode to produce a non-divergent laser beam.

According to a standard embodiment, the light produced 112 by the laser, with linear polarization, passes through the polarizer 103 and is attenuated by an absorbent neutral filter 104. A different type of filter can be used in other embodiments. The presence of this filter is not necessary to the invention. A quarter-wave plate 105 is placed at the output of the cube against the face from which the laser beam deflected by the splitter 101 leaves, or at a right angle to the beam incident to the cube. The fast axis of the quarter-wave plate 105 is oriented in such a way that the incident linear polarization 113 is modified to a circular polarization 114 according to a first direction of rotation. In other embodiments, the quarter-wave plate 105 is oriented in such a way that the incident linear polarization 113 is modified to a circular polarization according to a direction of rotation that is the reverse of the first. The laser ray of circular polarization 114 passes through the gas cell 106. According to a standard embodiment, the gas cell is produced in glass-silicon-glass by MEMS (microelectromechanical system) techniques with an internal volume typically less than 1 mm³ and filled with an absorbent medium of atomic vapor of alkaline metal (rubidium or cesium) type, and a buffer gas mixture. According to a standard embodiment, the gas cell is filled with rubidium-87 and a mixture of nitrogen and argon as buffer gas. In other embodiments, other types of cells can be filled with different internal gases. According to a particular embodiment, a cylindrical miniature cell can be used. According to another particular embodiment, the gas cell can be incorporated in the cube 101. The cell 106 can be filled with other types of alkaline metallic vapor (rubidium-85, natural rubidium, cesium-113 for example) and other types of buffer gas (Xe, Ne for example).

Embodiment of the CPT Clock

Figure 4:
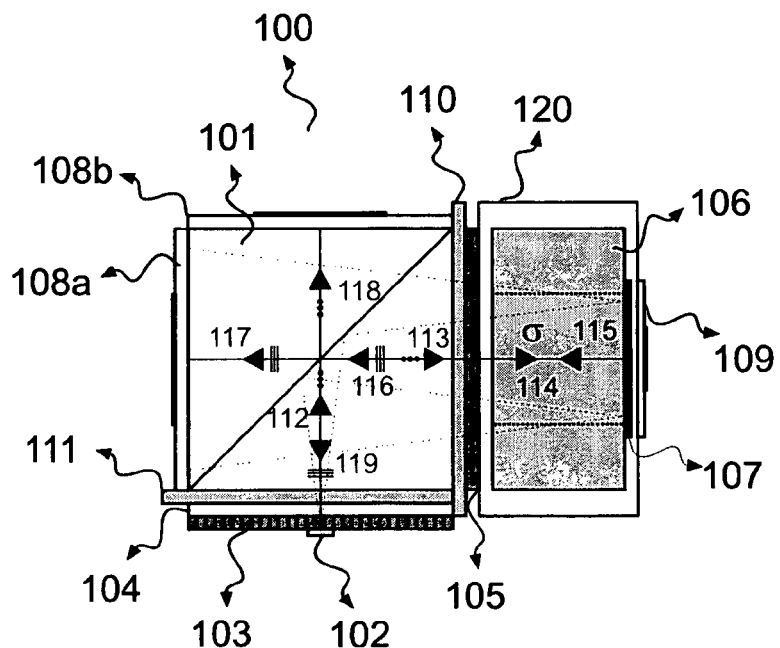
FIG. 4 is a schematic presentation of the design of the device of the invention with right-angle geometry and double passage

FIG. 4 illustrates the design of the device for the CPT clock. According to a standard embodiment (right-angle package), the splitting percentage of the splitter 101 is predefined so as to have a majority transmission and a minority reflection of at least 50% and of less than 50%, preferentially of at least 75% and of less than 25%, ideally of approximately 90% and 10% respectively.

After its interaction with the atoms of the alkaline metal vapor, the circularly polarized light beam 114 is mostly reflected by a mirror 107. In a standard CPT embodiment, the output window of the gas cell 106 is covered with metal (silver or gold for example) to act as reflector. In another embodiment, the coating of the output window of the gas cell may be a dielectric mirror. The transmission of the reflector 107 can be chosen so that a small portion of the light is transmitted toward the photodetector 109. The back-reflected light 115 passes through and interacts a second time with the atomic medium (double passage). At the output of the cell, the beam passes through the quarter-wave plate 105 which transforms its circular polarization into linear polarization 116, perpendicular to the transmission axis of the polarizer 103, and is mostly transmitted by the miniature splitter cube 101. This transmitted light beam 117 reaches the photodetector 108a which stores the absorption spectrum and more specifically the absorption reduction due to the coherent population trapping (CPT) process. In a standard CPT embodiment, the photodetector 108a is a photodetector of silicon type. In other CPT embodiments, different types of photodetectors can be used. The minority portion 119 of the beam 116 deflected by the splitter 101 is attenuated by the polarizer 103 and thus does not disturb the laser. In a particular embodiment, the photodetector 108a can be moved and can replace the mirror 107. In this particular case, a single-passage version of the model 100 would be created. The second photodetector 108b stores the light beam 118 transmitted initially by the miniature splitter cube 101. In this way, the output power of the laser source 102 can be measured and adjusted by a dedicated control loop. The diaphragms 110 and 111 are used to avoid having an undesirable light reach the photodetectors if the size of the laser beam is greater than the dimensions of the faces of the miniature splitter cube 101. The light stored by the photodetector 109 situated after the mirror 107 can be used for different types of control such as frequency of the laser or temperature of the cell.

Figure 5:
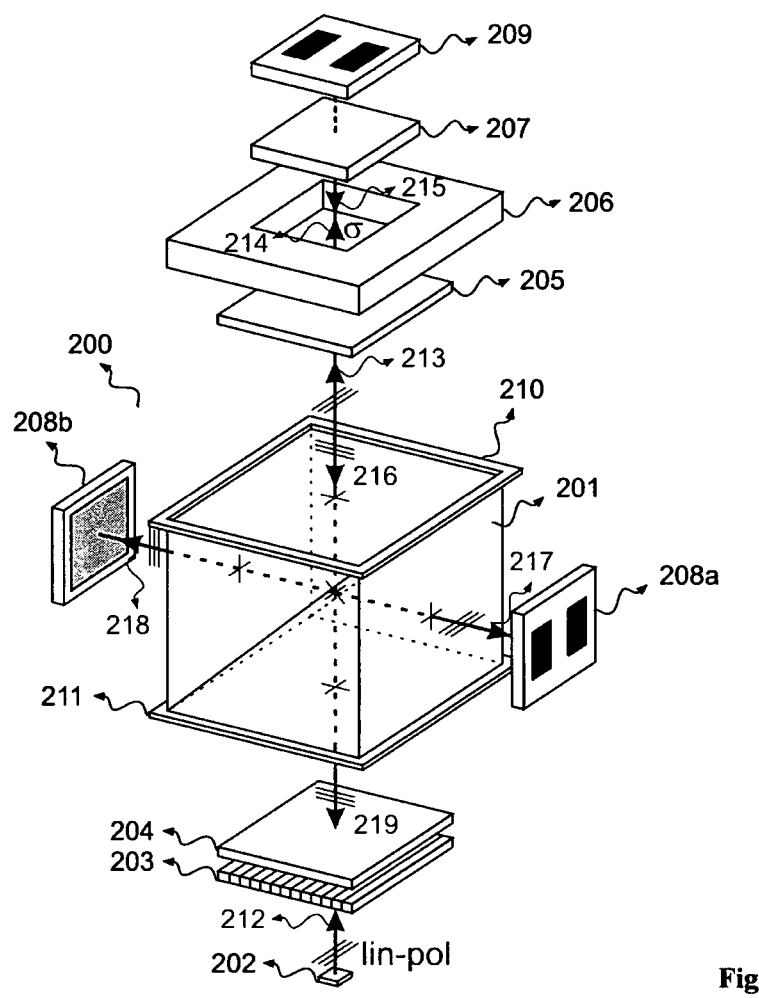
FIG. 5 is an exploded schematic presentation of the device of the invention with straight geometry and with double passage

In FIG. 6a, and according to an embodiment with straight geometry (exploded diagram of the package with straight geometry illustrated in FIG. 5), the splitting percentage of the splitter cube is predefined to be the inverse of that described above (right-angle package), namely a minority transmission and a majority reflection of less than 50% and at least 50%, preferentially less than 25% and at least 75%, ideally approximately 10% and 90% respectively. The design with straight optical double passage that is thus obtained 200 (the numeric coding begins at 200 for the design 200) is very similar to the design with right angle and double passage 100 (see FIG. 4). The role of the splitter 201 is thus reversed in order for the minority portion of the beam originating from the laser source 102 to be transmitted rather than deflected. For its part, the back-reflected beam 216 is then mostly deflected toward the photodetector 208a. The main difference in the arrangement of the different elements compared to the design 100 lies in the position of the "gas cell 206, quarter-wave plate 205, mirror 207 and photodetector 209" cell entity. In the model 200 of FIG. 6, the gas cell entity is placed above the splitter cube 201 and is therefore situated facing the laser 102. The photodetector 208b is placed at a right angle, where the light beam emitted by the laser is reflected by the splitter cube 201 and is used to measure the laser power. These differences apart, the operating principle of the design 200 is the same as for the model 100.

Embodiment of the Raman Oscillator

FIG. 7 illustrates an embodiment that is particularly suited to the concept of the Raman oscillator.

According to a standard embodiment (right angle package), the splitting percentage of the splitter 101 is predefined so as to have a minority transmission and a majority reflection of less than 20% and at least 80%, preferentially of less than 10% and at least 90%, more preferentially equal to or less than 2% and equal to or greater than 98%, ideally approximately 1% and 99% respectively. After its interaction with the atoms of the alkaline metal vapor, the incident light beam 114a and the light beam generated by the stimulated Raman diffusion (called a Raman beam) 114b are reflected by a mirror 107. In a standard Raman embodiment, the mirror 107 is reflective (reflective layer of gold or silver or Bragg mirror made of dielectric layers), it is inclined (typically by 2 to 3 degrees) and is concave with a focal length chosen so as to focus the back-reflected light beams 115 (incident and Raman beams) on the photodetector 108a. The mirror 107 has typical transmission of a few percent. These percent of transmitted light reach the surface of the photodetector 109 used to measure the absorption spectrum and to stabilize the optical frequency of the laser. In a different Raman embodiment, the output window of the gas cell 106 is concave, covered with silver (or another metal, such as, for example, gold, or even a Bragg mirror made of dielectric layers) and acts as reflector. In another Raman embodiment, the mirror is plane and a lens is used to focus the beam on the photodetector 108a. If the intensity of the Raman beam is sufficient, it is also possible to dispense with focusing means.

The back-reflected light beams 115 (incident and Raman) pass through and interact a second time with the atomic medium (double passage). The quarter-wave plate 105 transforms these circularly polarized light beams into light beams of linear polarization. These light beams are mostly deflected 119 (incident and Raman) and reach the first photodetector 108a which stores the frequency beat between the incident beam and the Raman beam. In a standard Raman embodiment, the first photodetector 108a is a high-speed semiconductor type photodetector (made of Si, GaAs or InGaAs) which is positioned at the focus of the concave mirror 107. In other Raman embodiments, different types of high-speed photodetectors can be used. The second photodetector 108b records the light 118 coming directly from the laser 102 and initially transmitted by the miniature splitter cube 101. In this way, the output power of the laser source 102 can be measured and regulated by a dedicated control loop. The photodetector 121 stores the back-reflected beam 117 transmitted by the splitter 101. The diaphragms 110 and 111 are used to avoid having an undesirable light reach the photodetectors if their dimensions are greater than those of the miniature splitter cube 101.

FIG. 6b illustrates the schematic representation of the package with straight geometry 200 with double passage of the Raman embodiment. All the numeric references correspond to the model 100 of the Raman embodiment and begin with "2" instead of "1".

Advantages of the Double-Passage Design with Polarizer:

As mentioned above, the advantages of the present invention lie in the use of a central cube (splitter cube) in a double-passage design. For an identical absorption path, the double-passage design allows the use of a more compact device compared to the design with a single passage. Overall, the double-passage design with a central splitter cube offers an option that is compact, robust and extremely versatile with many advantages over the known designs.

The versatility of the present design is due to the different roles played by the central splitter cube. The latter acts as a robust and stable anchorage which simplifies the mechanical design. The central splitter cube acts as a thermal insulator that prevents the photodetectors from being heated by the gas cell or the laser diode, both heated to a temperature of approximately 80° C. Associated with the polarizer and with the quarter-wave plate, the assembly acts as an optical insulator and a filter. The light which enters into the quarter-wave plate is perfectly linearly polarized, which allows for a single circular polarization and thus an optimal light-atom interaction efficiency. After a double interaction with the atomic medium, the outgoing light beam is filtered so that most of the light reaches the photodetector. That portion of the beam which is back-reflected toward the laser diode is blocked by the polarizer, which avoids disturbing the emission of the laser beam and allows for the practical production of a device with double passage.

This thermal insulation also allows for a separate temperature control, without interference from the gas cell and the laser diode. Finally, the design with central splitter cube with two photodetectors makes it possible to simultaneously measure the clock signal and the output power of the laser diode. In other designs, the laser power measurement and the CPT measurements are performed by means of a single photodetector, designs in which the influences of the temperature of the gas cell and the intrinsic output power of the laser diode on the amplitude of the photodetector signal cannot be differentiated.

The invention claimed is:
1. A device for an atomic clock comprising:
a laser source generating a laser beam,
a splitter for allowing a first portion of the laser beam to pass according to a predefined percentage and deflecting a second portion of the laser beam,
a quarter-wave plate modifying a linear polarization of the first portion of the laser beam into a circular polarization and vice versa, a gas cell passed through by the first portion of the laser beam of circular polarization, a mirror sending the first portion of the laser beam back toward the gas cell, a first photodetector, the splitter being placed between the laser source and the mirror, the quarter-wave plate being placed between the splitter and the mirror, the gas cell being placed between the quarter-wave plate and the mirror, in such a way that the polarization of the first portion of the laser beam originating from the laser source via the splitter and arriving on the quarter-wave plate is linear according to a first angle and is modified by the quarter-wave plate into circular polarization, and the circular polarization of the first portion of the laser beam reflected by the mirror and passing a second time through the gas cell is modified into linear polarization according to a second angle by the quarter-wave plate, the splitter directing a portion of the back-reflected first portion of the laser beam toward the first photodetector, a polarizer being placed between the output of the laser beam and the splitter in order to protect the laser source from back-reflections originating from the various optical elements that make up the device, a second photodetector being placed after the splitter in such a way that the second portion of the laser beam reaches said second photodetector without having passed through the gas cell.

2. The device as claimed in claim 1, which comprises a third photodetector, placed behind the mirror, said mirror being semi-transparent and allowing a portion of the laser beam to pass, said third photodetector being used to control the optical frequency of the laser and/or to control the temperature of the cell.

3. The device as claimed in claim 2, which comprises a first diaphragm placed between the splitter and the gas cell, the first diaphragm reducing the size of the laser beam.

4. The device as claimed in claim 3, which comprises a second diaphragm placed between the laser source and the splitter, the second diaphragm reducing the size of the laser beam.

5. The device as claimed in claim 2, which comprises a second diaphragm placed between the laser source and the splitter, the second diaphragm reducing the size of the laser beam.

6. The device as claimed in claim 1, which comprises a first diaphragm placed between the splitter and the gas cell, the first diaphragm reducing the size of the laser beam.

7. The device as claimed in claim 6, which comprises a second diaphragm placed between the laser source and the splitter, the second diaphragm reducing the size of the laser beam.

8. The device as claimed in claim 1, which comprises a second diaphragm placed between the laser source and the splitter, the second diaphragm reducing the size of the laser beam.

9. The device as claimed in claim 1, wherein the second photodetector is used to measure and/or adjust the output power of the laser source.

* * * * *